(12) United States Patent
Zheng

(10) Patent No.: US 12,266,676 B2
(45) Date of Patent: Apr. 1, 2025

(54) SOLID-STATE IMAGING DEVICE WITH ANTI-REFLECTION FILM

(71) Applicants: KABUSHIKI KAISHA TOSHIBA, Tokyo (JP); Toshiba Electronic Devices & Storage Corporation, Tokyo (JP)

(72) Inventor: Yuexing Zheng, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 18/175,881

(22) Filed: Feb. 28, 2023

(65) Prior Publication Data

US 2024/0105754 A1   Mar. 28, 2024

(30) Foreign Application Priority Data

Sep. 22, 2022   (JP) .................................. 2022-151885

(51) Int. Cl.
*H01L 27/146* (2006.01)
*H10K 59/35* (2023.01)

(52) U.S. Cl.
CPC ...... *H01L 27/14645* (2013.01); *H01L 27/146* (2013.01); *H01L 27/14621* (2013.01); *H01L 27/14623* (2013.01); *H01L 27/14685* (2013.01); *H01L 27/14687* (2013.01);
(Continued)

(58) Field of Classification Search
CPC ......... H01L 27/14645; H01L 27/14621; H01L 27/14623; H01L 27/14685; H01L 27/14687; H01L 27/14689; H10K 59/352
See application file for complete search history.

(56) References Cited

U.S. PATENT DOCUMENTS

| | | |
|---|---|---|
| 7,518,096 B2 | 4/2009 | Noda |
| 8,728,853 B2 | 5/2014 | Yutani et al. |
| 10,714,515 B2 | 7/2020 | Shinohara |

(Continued)

FOREIGN PATENT DOCUMENTS

| | | |
|---|---|---|
| JP | 2009-088261 A | 4/2009 |
| JP | 2019-046960 A | 3/2019 |

(Continued)

*Primary Examiner* — Jennifer D Bennett
*Assistant Examiner* — Erin R Garber
(74) *Attorney, Agent, or Firm* — Foley & Lardner LLP

(57) ABSTRACT

A solid-state imaging device according to the present embodiment includes a semiconductor region and an antireflection film. In the semiconductor region, a blue photodiode that detects blue light, a green photodiode that detects green light, and a red photodiode that detects red light are arranged. The antireflection film includes a first insulating film disposed on the semiconductor region and a second insulating film disposed on the first insulating film and having a refractive index higher than a refractive index of the first insulating film. At least one of the first insulating film and the second insulating film has a film thickness in a region through which light received by the blue photodiode is transmitted thinner than a film thickness in a region through which light received by the green photodiode is transmitted.

17 Claims, 10 Drawing Sheets

(52) U.S. Cl.
CPC ..... *H01L 27/14689* (2013.01); *H10K 59/352* (2023.02); *H01L 27/1462* (2013.01); *H01L 27/14627* (2013.01)

(56) References Cited

U.S. PATENT DOCUMENTS

| | | | |
|---|---|---|---|
| 11,018,181 B2 | 5/2021 | Hasegawa | |
| 2005/0103983 A1* | 5/2005 | Yamaguchi | H01L 31/0232 257/E31.127 |
| 2009/0045477 A1* | 2/2009 | Narui | G02B 1/11 257/E31.127 |
| 2009/0302409 A1 | 12/2009 | Qian et al. | |
| 2011/0108705 A1* | 5/2011 | Izuha | H01L 31/0232 257/E31.127 |
| 2015/0035101 A1* | 2/2015 | Naruse | H01L 27/14621 257/432 |
| 2015/0084144 A1* | 3/2015 | Suzuki | H01L 27/14647 438/70 |
| 2020/0099881 A1* | 3/2020 | Kurokawa | H01L 27/1464 |
| 2020/0227467 A1 | 7/2020 | Yokogawa | |
| 2020/0295078 A1 | 9/2020 | Itabashi | |
| 2021/0327929 A1 | 10/2021 | Takiguchi et al. | |
| 2022/0359583 A1* | 11/2022 | Huang | H01L 27/14645 |
| 2023/0009280 A1* | 1/2023 | Yoo | H01L 27/1463 |

FOREIGN PATENT DOCUMENTS

| | | | |
|---|---|---|---|
| JP | 2019-114642 A | 7/2019 | |
| JP | 2019-204932 A | 11/2019 | |
| JP | 2020-072195 A | 5/2020 | |
| JP | 2020-150032 A | 9/2020 | |
| JP | 2020-150194 A | 9/2020 | |
| JP | 6971722 B2 | 11/2021 | |
| JP | 2022-032676 A | 2/2022 | |
| WO | WO-2014021130 A1 * | 2/2014 | ....... H01L 27/14621 |
| WO | WO-2020/122032 A1 | 6/2020 | |

* cited by examiner

| Blue TRANSMITTANCE | | T5b (Å) | | | | | | | | | | | |
|---|---|---|---|---|---|---|---|---|---|---|---|---|---|
| | | 50 | 100 | 150 | 200 | 250 | 300 | 350 | 400 | 450 | 500 | 550 | 600 |
| T4b (Å) | 50 | 75.1% | 76.7% | 78.7% | 81.3% | 84.1% | 87.0% | 89.8% | 92.2% | 94.0% | 94.8% | 94.7% | 93.6% |
| | 100 | 75.8% | 77.9% | 80.5% | 83.4% | 86.4% | 89.3% | 91.7% | 93.4% | 94.2% | 94.0% | 92.7% | 90.7% |
| | 150 | 76.3% | 79.0% | 82.0% | 85.1% | 88.0% | 90.6% | 92.3% | 93.2% | 92.9% | 91.6% | 89.4% | 86.7% |
| | 200 | 76.8% | 79.9% | 83.1% | 86.2% | 88.9% | 90.8% | 91.7% | 91.5% | 90.2% | 88.0% | 85.2% | 82.0% |
| | 250 | 77.2% | 80.5% | 83.8% | 86.6% | 88.8% | 89.9% | 89.9% | 88.6% | 86.5% | 83.6% | 80.4% | 77.1% |
| | 300 | 77.5% | 80.9% | 83.9% | 86.3% | 87.8% | 88.0% | 87.0% | 84.9% | 82.1% | 78.8% | 75.4% | 72.3% |
| | 350 | 77.6% | 80.9% | 83.6% | 85.4% | 86.0% | 85.3% | 83.4% | 80.7% | 77.4% | 74.0% | 70.7% | 67.7% |
| | 400 | 77.6% | 80.6% | 82.8% | 83.8% | 83.6% | 82.0% | 79.5% | 76.3% | 72.8% | 69.4% | 66.2% | 63.6% |
| | 450 | 77.4% | 80.0% | 81.5% | 81.8% | 80.7% | 78.5% | 75.4% | 72.0% | 68.4% | 65.2% | 62.3% | 60.0% |
| | 500 | 77.1% | 79.2% | 80.0% | 79.4% | 77.6% | 74.8% | 71.4% | 67.9% | 64.5% | 61.4% | 58.9% | 56.9% |
| | 550 | 76.7% | 78.1% | 78.1% | 76.8% | 74.4% | 71.2% | 67.7% | 64.2% | 61.0% | 58.2% | 56.0% | 54.3% |
| | 600 | 76.1% | 76.9% | 76.2% | 74.2% | 71.3% | 71.4% | 64.4% | 61.0% | 58.0% | 55.5% | 53.6% | 52.3% |

FIG. 5

SOLID-STATE IMAGING DEVICE WITH ANTI-REFLECTION FILM

CROSS-REFERENCE TO RELATED APPLICATIONS

This application is based upon and claims the benefit of priority from the prior Japanese Patent Application No. 2022-151885, filed on Sep. 22, 2022; the entire contents of which are incorporated herein by reference.

FIELD

Embodiments described herein relate generally to a solid-state imaging device.

BACKGROUND

A solid-state imaging device includes an antireflection film (AR filter) on a light receiving element (photodiode) of a pixel in order to receive more light and improve sensitivity. However, in the conventional antireflection film, the transmittance of light in a blue wavelength band (for example, light in a wavelength band of about 400 nm to 500 nm) is lower than the transmittance of light having a longer wavelength (green and red light), so that the spectral sensitivity of the entire solid-state imaging device decreases in the blue wavelength band and becomes non-uniform in the entire visible range. Note that, in a case where the antireflection film is adapted to blue light in order to increase the transmittance in the blue wavelength band, the transmittance of light in the green and red wavelength bands decreases. Furthermore, as means for increasing the spectral sensitivity in the blue wavelength band of the solid-state imaging device, for example, there is a method using a microlens, but it is not suitable for increasing an area of the solid-state imaging device.

BRIEF DESCRIPTION OF THE DRAWINGS

FIG. 5 is a diagram illustrating an example of film thickness dependency of transmittance of light in a blue wavelength band of an antireflection film used in a solid-state imaging device according to an embodiment.

DETAILED DESCRIPTION

Figure 1:
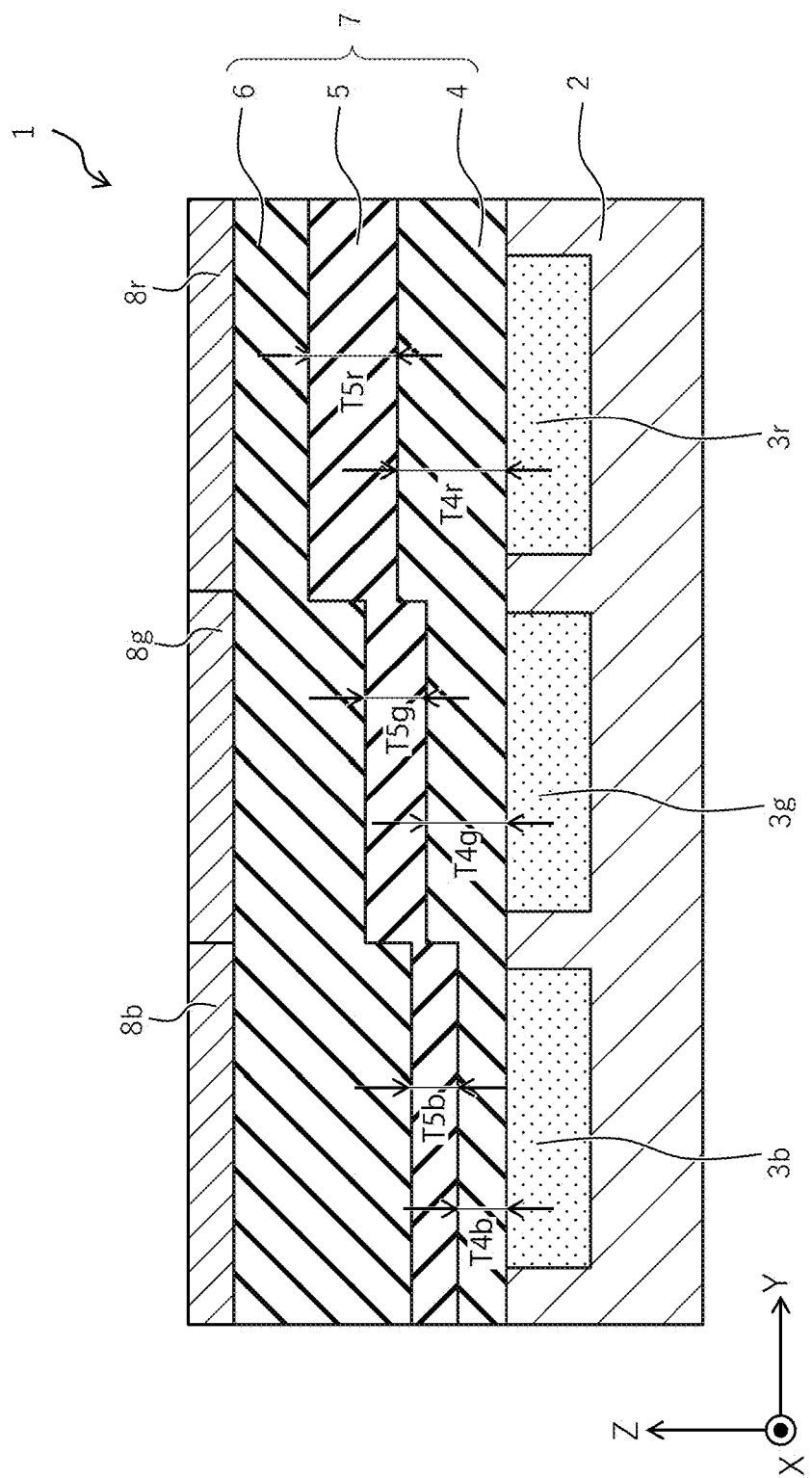
FIG. 1 is a cross-sectional view of a solid-state imaging device according to an embodiment.

A solid-state imaging device according to the present embodiment includes a semiconductor region and an antireflection film. In the semiconductor region, a blue photodiode that detects blue light, a green photodiode that detects green light, and a red photodiode that detects red light are arranged. The antireflection film includes a first insulating film disposed on the semiconductor region and a second insulating film disposed on the first insulating film and having a refractive index higher than a refractive index of the first insulating film. At least one of the first insulating film and the second insulating film has a film thickness in a region through which light received by the blue photodiode is transmitted thinner than a film thickness in a region through which light received by the green photodiode is transmitted.

Embodiments will now be explained with reference to the accompanying drawings. The embodiments do not limit the present invention. The drawings are schematic or conceptual, and a ratio of each portion and the like are not necessarily the same as actual ones. In the specification and the drawings, the same elements as those described above with respect to the previously described drawings are denoted by the same reference signs, and the detailed description thereof is appropriately omitted.

For convenience of description, an XYZ orthogonal coordinate system is adopted as illustrated in the drawings. A Z-axis direction is a stacking direction (thickness direction) of the solid-state imaging device. Furthermore, in the Z direction, a side of a color filter is also referred to as "upper", and a side of a semiconductor region 2 is also referred to as "lower". However, this expression is for convenience and independent of a direction of gravity.

A solid-state imaging device 1 according to an embodiment will be described with reference to FIG. 1. The solid-state imaging device 1 may be a linear sensor in which pixels are arranged in a line, or may be an area sensor in which pixels are arranged in both vertical and horizontal directions. Furthermore, the solid-state imaging device 1 may be a CMOS sensor or a CCD sensor.

As illustrated in FIG. 1, the solid-state imaging device 1 includes a semiconductor region 2, a photodiode 3*b*, a photodiode 3*g*, a photodiode 3*r*, an antireflection film 7, a blue color filter 8*b*, a green color filter 8*g*, and a red color filter 8*r*. Hereinafter, details of each element will be described with reference to FIG. 1.

Note that, in the following description, the photodiode 3*b*, the photodiode 3*g*, and the photodiode 3*r* may be collectively referred to as a "photodiodes 3*b*, 3*g*, and 3*r*". Furthermore, the blue color filter 8*b*, the green color filter 8*g*, and the red color filter 8*r* may be collectively referred to as a "color filter 8".

The semiconductor region 2 is a region made of a semiconductor, and is made of silicon in the present embodiment. Note that the semiconductor region 2 may be an epitaxial layer, may be at least a part of a semiconductor substrate, or may include an epitaxial layer and a semiconductor substrate.

The photodiode 3 is disposed in the semiconductor region 2. The photodiode 3*b* is a photodiode that detects blue light (for example, light in a wavelength band of about 400 nm to 500 nm). The photodiode 3*g* is a photodiode that detects green light (for example, light in a wavelength band of about 500 nm to 650 nm). The photodiode 3*r* is a photodiode that detects red light (for example, light in a wavelength band of about 650 nm to 900 nm).

Figure 2:
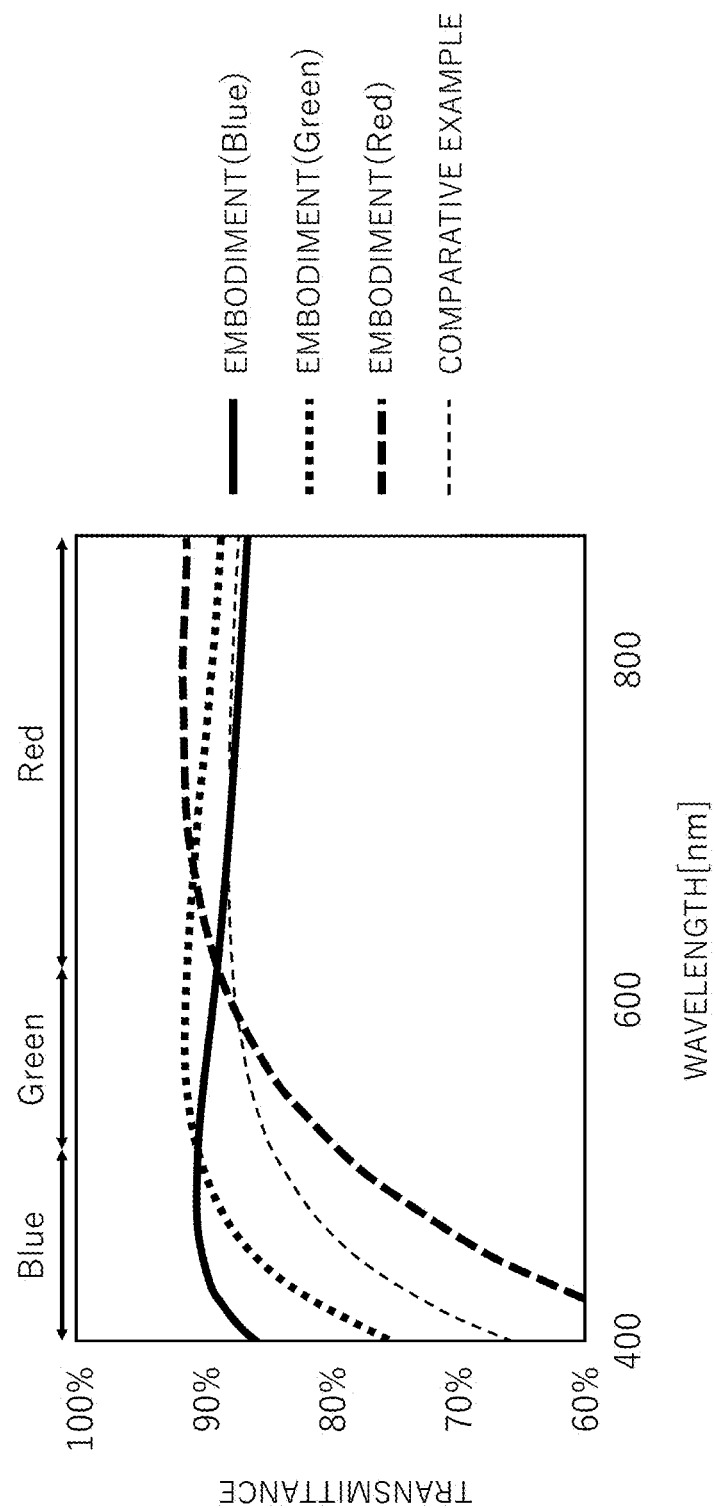
FIG. 2 is a diagram illustrating an example of wavelength dependency of transmittance of an antireflection film of the solid-state imaging device according to the embodiment.

Note that, in FIG. 2, the photodiodes 3*b*, 3*g*, and 3*r* are arranged on a straight line, but the present invention is not limited thereto. For example, the photodiode 3*b*, the photodiode 3*g*, and the photodiode 3*r* may be arranged according to a predetermined arrangement such as a Bayer arrangement.

The antireflection film 7 includes a first insulating film 4, a second insulating film 5, and a third insulating film 6. The second insulating film 5 has a higher refractive index than the first insulating film 4 and the third insulating film 6.

As a combination of materials of the first insulating film 4, the second insulating film 5, and the third insulating film having the above-described refractive index relationship, for example, the first insulating film 4 is made of silicon oxide ($SiO_2$), the second insulating film 5 is made of silicon nitride (SiN), and the third insulating film 6 is made of silicon oxide (configuration example 1). Note that the first insulating film 4 may be made of aluminum oxide ($Al_2O_3$), the second insulating film 5 may be made of zirconium oxide ($ZrO_2$), and the third insulating film 6 may be made of silicon oxide (configuration example 2). Furthermore, the first insulating film 4 may be made of silicon oxide, the second insulating film 5 may be made of hafnium oxide ($HfO_2$), and the third insulating film 6 may be made of silicon oxide (configuration example 3).

Tables 1 to 3 show the respective materials and refractive indexes of the configuration examples 1 to 3 of the antireflection film 7.

TABLE 1

| Antireflection film 7 (configuration example 1) | | Refractive index |
| --- | --- | --- |
| First insulating film 4 | $SiO_2$ | 1.4 |
| Second insulating film 5 | SiN | 2 |
| Third insulating film 6 | $SiO_2$ | 1.4 |
| Semiconductor region 2 | Si | 4 |

TABLE 2

| Antireflection film 7 (configuration example 2) | | Refractive index |
| --- | --- | --- |
| First insulating film 4 | $Al_2O_3$ | 1.4 |
| Second insulating film 5 | $ZrO_2$ | 2.2 |
| Third insulating film 6 | $SiO_2$ | 1.8 |
| Semiconductor region 2 | Si | 4 |

TABLE 3

| Antireflection film 7 (configuration example 3) | | Refractive index |
| --- | --- | --- |
| First insulating film 4 | $SiO_2$ | 1.4 |
| Second insulating film 5 | $HfO_2$ | 1.9 |
| Third insulating film 6 | $SiO_2$ | 1.4 |
| Semiconductor region 2 | Si | 4 |

Since the third insulating film 6 is disposed on the second insulating film 5 and has a film thickness sufficiently larger than film thicknesses of the first insulating film 4 and the second insulating film 5, the third insulating film 6 absorbs a difference in the film thickness of the insulating film (the first insulating film 4 and/or the second insulating film 5) in each of the blue, red, and green regions. The third insulating film 6 has a substantially planar upper surface. The third insulating film 6 has a refractive index lower than that of the second insulating film 5. The third insulating film 6 is made of, for example, silicon oxide.

The blue color filter 8*b* attenuates light in a wavelength band other than the blue wavelength band among light incident on the photodiode 3*b*. The blue color filter 8*b* is disposed on the third insulating film 6 so as to be positioned above the photodiode 3*b*. The green color filter 8*g* attenuates light in a wavelength band other than the green wavelength band among light incident on the photodiode 3*g*. The green color filter 8*g* is disposed on the third insulating film 6 so as to be positioned above the photodiode 3*g*. The red color filter 8*r* attenuates light in a wavelength band other than the red wavelength band among light incident on the photodiode 3*r*. The red color filter 8*r* is disposed on the third insulating film 6 so as to be positioned above the photodiode 3*r*.

The color filter 8 is formed by depositing a filter material on the third insulating film 6 by, for example, physical vapor deposition (PVD). The color filter 8 may be formed by applying (spin coating) a filter material onto the third insulating film 6.

Next, a film thickness of the insulating film of the antireflection film 7 will be described in detail. As illustrated in FIG. 1, the first insulating film 4 has a film thickness T4*b* in a region through which light received by the photodiode 3*b* is transmitted, a film thickness T4*g* in a region through which light received by the photodiode 3*g* is transmitted, and a film thickness T4*r* in a region through which light received by the photodiode 3*r* is transmitted. The film thickness T4*b*, the film thickness T4*g*, and the film thickness T4*r* are examples of a first film thickness, a second film thickness, and a third film thickness in the claims, respectively.

The second insulating film 5 has a film thickness T5*b* in a region through which light received by the photodiode 3*b* is transmitted, a film thickness T5*g* in a region through which light received by the photodiode 3*g* is transmitted, and a film thickness T5*r* in a region through which light received by the photodiode 3*r* is transmitted. The film thickness T5*b*, the film thickness T5*g*, and the film thickness T5*r* are examples of a fourth film thickness, a fifth film thickness, and a sixth film thickness in the claims, respectively.

In the present embodiment, as can be seen from FIG. 1, a magnitude of each film thickness satisfies a magnitude relationship of T4*b*<T4*g*<T4*r* and T5*b*<T5*g*<T5*r*. This makes it possible to obtain transmittance at an equivalent level between RGB. For example, T4*b* is 50 Å, T4*g* is 100 Å, T4*r* is 150 Å, and T5*b* is 500 Å, T5*g* is 550 Å, and T5*r* is 600 Å. Note that, with regard to the thickness of the second insulating film 5, it may be T5*b*=T5*g*. That is, the magnitude of each film thickness satisfies a magnitude relationship of T4*b*<T4*g*<T4*r* and T5*b* T5*g*<T5*r*.

In the present embodiment, the film thicknesses of the first insulating film 4 and the second insulating film 5 are formed so as to satisfy the above magnitude relationship. As a result, the transmittance of light in the blue wavelength band can be greatly improved. Furthermore, although not as much as the blue wavelength band, the transmittance of light in the green and red wavelength bands is also improved.

As a result, the spectral sensitivity characteristic of the solid-state imaging device 1 can be made uniform. This will be described in detail with reference to FIG. 2. FIG. 2 is a graph illustrating an example of a simulation result regarding wavelength dependency of transmittance of the antireflection film 7 of the solid-state imaging device 1. Here, for example, an item "embodiment (Blue)" indicates wavelength dependency of transmittance of the antireflection film 7 in a region through which light received by the photodiode 3b is transmitted. In the simulation, the configuration of the antireflection film 7 is the above-described configuration example 1 ($SiO_2$/SiN/$SiO_2$). Furthermore, FIG. 2 also illustrates a simulation result of wavelength dependence of transmittance of an antireflection film in a solid-state imaging apparatus according to a comparative example. The antireflection film in the comparative example includes two insulating films having different refractive indexes similarly to the antireflection film 7, but a thickness of each insulating film is constant regardless of a location (region).

As can be seen from the comparative example illustrated in FIG. 2, in a case where a thickness of the insulating film included in the antireflection film is made constant, the transmittance in the blue wavelength band is particularly low. Furthermore, when the thickness of the insulating film included in the antireflection film is adjusted in order to improve the transmittance in the blue wavelength band, the transmittance in the green and red wavelength bands decreases this time. As described above, in the comparative example, it is difficult to improve the transmittance in the blue wavelength band without decreasing the transmittance in the green wavelength band and the red wavelength band.

On the other hand, in the antireflection film 7 of the present embodiment, the thickness of each insulating film (the first insulating film 4 and the second insulating film 5) is adjusted for each region through which light received by each photodiode is transmitted. That is, by setting the thickness of each insulating film to a thickness suitable for each color wavelength band, as illustrated in FIG. 2, higher transmittance than that of the comparative example can be realized in the wavelength bands of all colors. Furthermore, in particular, transmittance higher than that of the comparative example can be realized in the blue wavelength band.

Furthermore, according to the present embodiment, it is possible to increase the transmittance in the blue wavelength band while maintaining the transmittance in the green and red wavelength bands high, and thus, it is possible to improve the uniformity of the transmittance between the wavelength bands. Therefore, it is possible to provide the solid-state imaging device 1 in which uniformity of spectral sensitivity is improved between the wavelength bands.

Note that, in the description of the above embodiment, the magnitudes of the film thicknesses are in the relationship of $T4b<T4g<T4r$ and $T5b<T5g<TSr$, but may not necessarily have such a magnitude relationship. For example, in a case where it is only necessary to have a certain degree of transmittance (for example, in a case where it is not necessary to maximize the transmittance in each wavelength band), the film thickness of any one of the first insulating film 4 and the second insulating film 5 may be uniform. That is, $T4b=T4g=T4r$ or $T5b=T5g=T5r$ may be satisfied. Hereinafter, a modification example in a case where either the film thickness of the first insulating film 4 or the film thickness of the second insulating film 5 is constant will be described.

Next, two modification examples according to the present embodiment will be described.

First Modification Example

Figure 3:
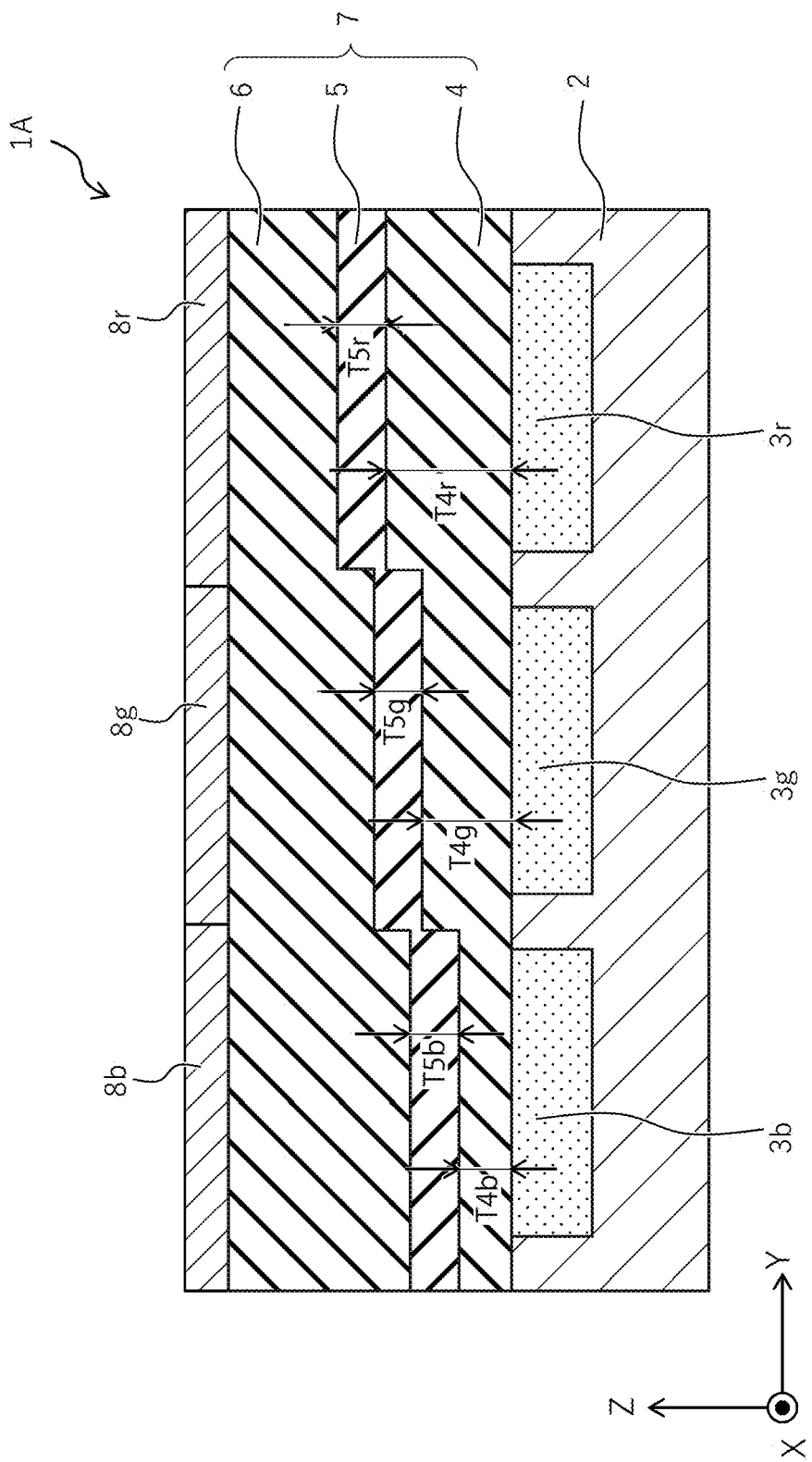
FIG. 3 is a cross-sectional view of a modification example of the solid-state imaging device according to the embodiment.

A solid-state imaging device 1A according to a first modification example of the embodiment will be described with reference to FIG. 3. As illustrated in FIG. 3, in the solid-state imaging device 1A, a film thickness of the second insulating film 5 is constant. That is, $T5b=T5g=T5r$. A film thickness of the first insulating film 4 has a magnitude relationship of $T4b<T4g$ $T4r$. For example, in a case where the first insulating film 4 is silicon oxide and the second insulating film 5 is silicon nitride, as an example, $T4b$ is 200 Å, $T4g$ and $T4r$ are 475 Å, and $T5b$, $T5g$ and $T5r$ are 200 Å.

Also in the present modified example, by setting the film thickness of the first insulating film 4 to have the above magnitude relationship for each photodiode, high transmittance can be achieved in any wavelength band.

Moreover, according to the present modification example, since it is not necessary to change the film thickness of the second insulating film 5, a part of a manufacturing process to be described later (see FIGS. 6C(4) to 6E(3)) can be omitted.

Second Modification Example

Figure 4:
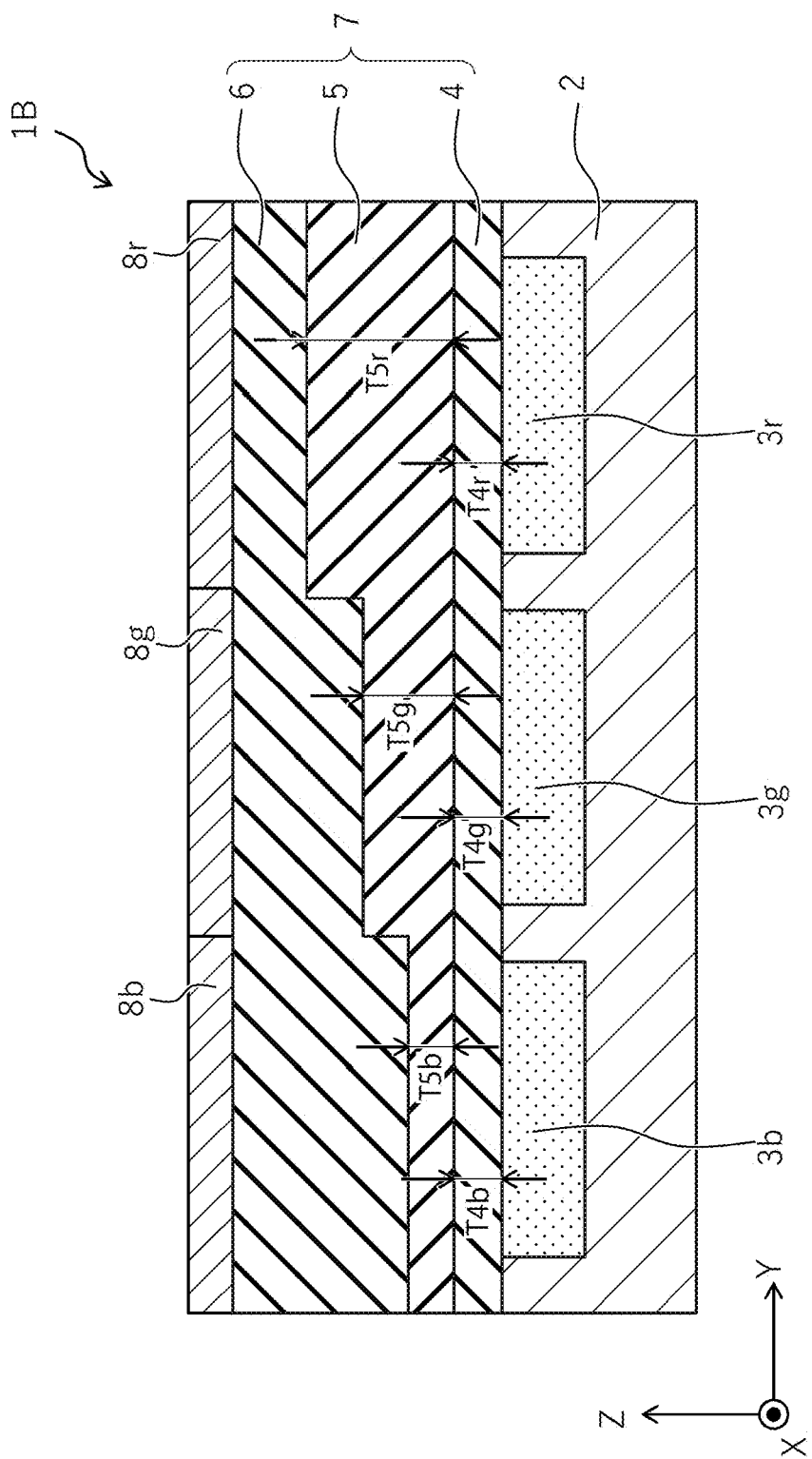
FIG. 4 is a cross-sectional view of another modification example of the solid-state imaging device according to the embodiment.

Next, a solid-state imaging device 1B according to a second modification example of the embodiment will be described with reference to FIG. 4. As illustrated in FIG. 4, in the solid-state imaging device 1B, a film thickness of the first insulating film 4 is constant. That is, $T4b=T4g=T4r$. A film thickness of the second insulating film 5 has a magnitude relationship of $T5b<T5g$ $T5r$. For example, in a case where the first insulating film 4 is silicon oxide and the second insulating film 5 is silicon nitride, as an example, $T4b$, $T4g$, and $T4r$ are 475 Å, and $T5b$ is 100 Å, $T5g$ and $T5r$ are 200 Å.

Also in the present modified example, high transmittance can be achieved in any wavelength band by changing the film thickness of the second insulating film 5 for each photodiode.

Moreover, since it is not necessary to change the film thickness of the first insulating film 4, a part of the manufacturing process to be described later (see FIGS. 6A(3) to 6C(2)) can be omitted.

As illustrated in the first modification example and the second modification example, in order to increase the transmittance in the blue wavelength band, at least one of $T4b<T4g$ and $T5b<T5g$ may be satisfied.

As described above, in order to increase the transmittance in the blue wavelength band, it is sufficient that at least one of the first insulating film 4 and the second insulating film 5 has a film thickness in a region through which light received by the photodiode 3b is transmitted thinner than a film thickness in a region through which light received by the photodiode 3g is transmitted.

Next, specific numerical ranges of the film thickness (film thickness $T4b$) of the first insulating film 4 and the film thickness (film thickness $T5b$) of the second insulating film 5 in the blue wavelength band, which can achieve higher transmittance than that of the comparative example, will be described.

FIG. 5 illustrates a simulation result of the transmittance of blue light when the film thicknesses of the first insulating film 4 and the second insulating film 5 are changed. That is, FIG. 5 illustrates the transmittance of blue light when the film thickness T4b and the film thickness T5b are changed. In FIG. 5, as an example of a reference, a portion where the transmittance is 90% or more is shaded. The transmittance was obtained from a multilayer film interference spectrum in which light polarization (S-polarized light and P-polarized light) was also taken into consideration using a thin film interference model in which the second insulating film 5 was a thin film. As simulation conditions, the semiconductor region 2, the first insulating film 4, the second insulating film 5, and the third insulating film 6 are made of silicon (Si), silicon oxide, silicon nitride, and silicon oxide, respectively.

In a case where it is attempted to obtain a transmittance of 90% or more in the blue wavelength band, as can be seen from FIG. 5, for example, the film thickness T4b may be 50 Å or more and 100 Å or less, and the film thickness T5b may be 400 Å or more and 600 Å or less. Furthermore, the film thickness T4b may be 100 Å or more and 150 Å or less, and the film thickness T5b may be 350 Å or more and 500 Å or less. Alternatively, the film thickness T4b may be 150 Å or more and 200 Å or less, and the film thickness T5b may be 300 Å or more and 450 Å or less.

<Method of Manufacturing Solid-State Imaging Device>

Next, an example of a method of manufacturing the solid-state imaging device 1 will be described with reference to FIGS. 6A to 6E. FIGS. 6A to 6E are process cross-sectional views for explaining the method of manufacturing the solid-state imaging device 1.

Figure 6A:
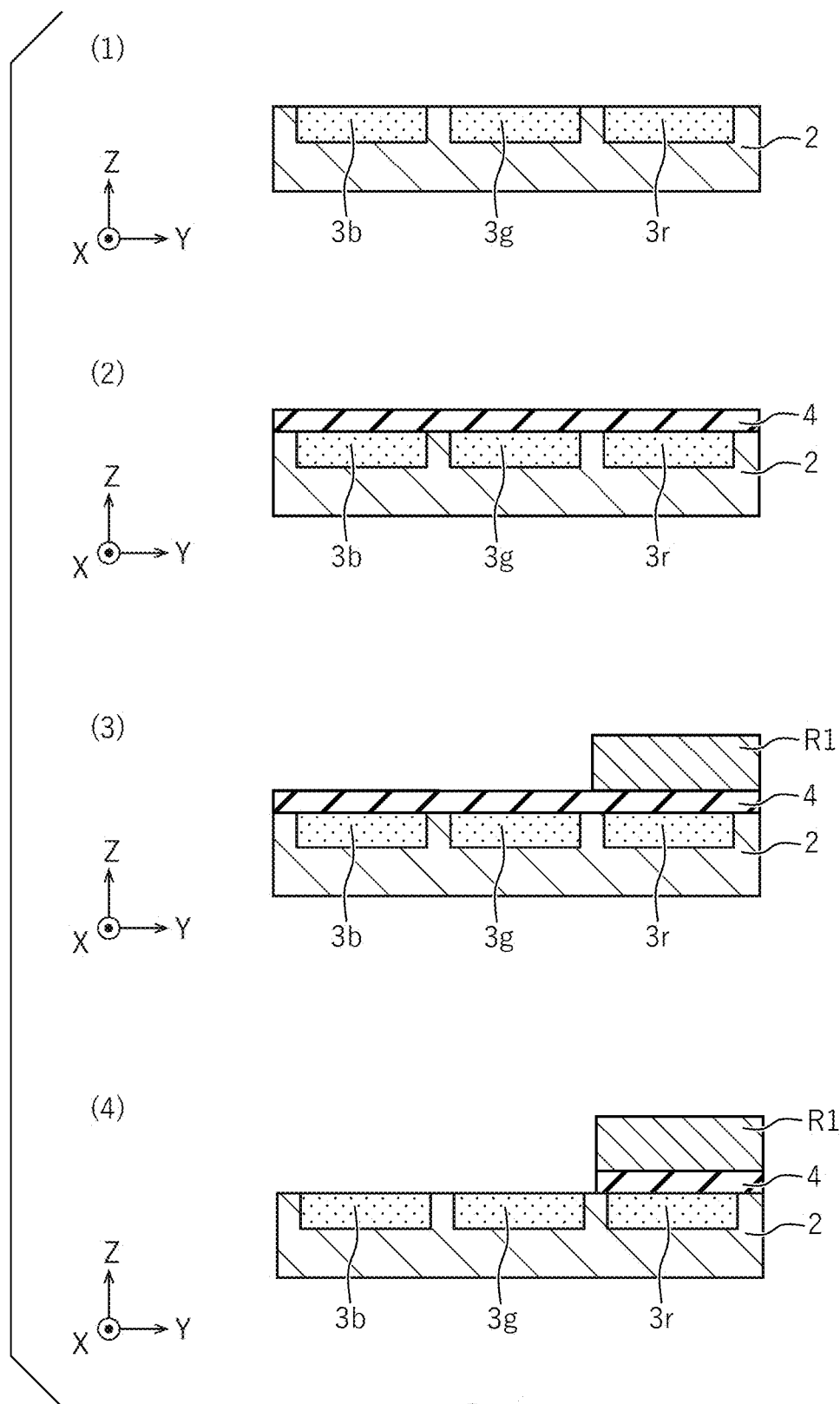
FIG. 6A is a cross-sectional view for explaining an example of a step in a method of manufacturing the solid-state imaging device according to the embodiment.

First, as illustrated in FIG. 6A(1), the semiconductor region 2 is prepared. For the semiconductor region 2, for example, a semiconductor substrate made of silicon (Si), silicon carbide (SiC), or the like may be used.

Next, as illustrated in FIG. 6A(1), the photodiode 3b, the photodiode 3g, and the photodiode 3r are formed in the semiconductor region 2. Note that an arrangement order of the photodiodes 3b, 3g, and 3r is not limited to the illustrated order, and may be any order.

Next, as illustrated in FIG. 6A(2), the first insulating film 4 is formed on the photodiodes 3b, 3g, and 3r. The first insulating film 4 is formed by, for example, depositing a first material on the photodiodes 3a, 3b, and 3c by physical vapor deposition (PVD), chemical vapor deposition (CVD), or thermal oxidation. For example, 200 Å of the first material is deposited. The first material is, for example, silicon oxide, aluminum oxide, or the like.

Next, as illustrated in FIG. 6A(3), a photoresist is applied onto the photodiodes 3b, 3g, and 3r, and selectively exposed and developed to form a resist mask R1 on the first insulating film 4 above the photodiode 3r.

Next, as illustrated in FIG. 6A(4), etching for removing the first insulating film 4 in a portion (that is, a portion above the photodiodes 3b and 3g) not covered with the resist mask R1 is performed. The etching is, for example, wet etching using an etching solution. Note that all of the portions of the first insulating film 4 not covered with the resist mask may not be removed by etching.

Figure 6B:
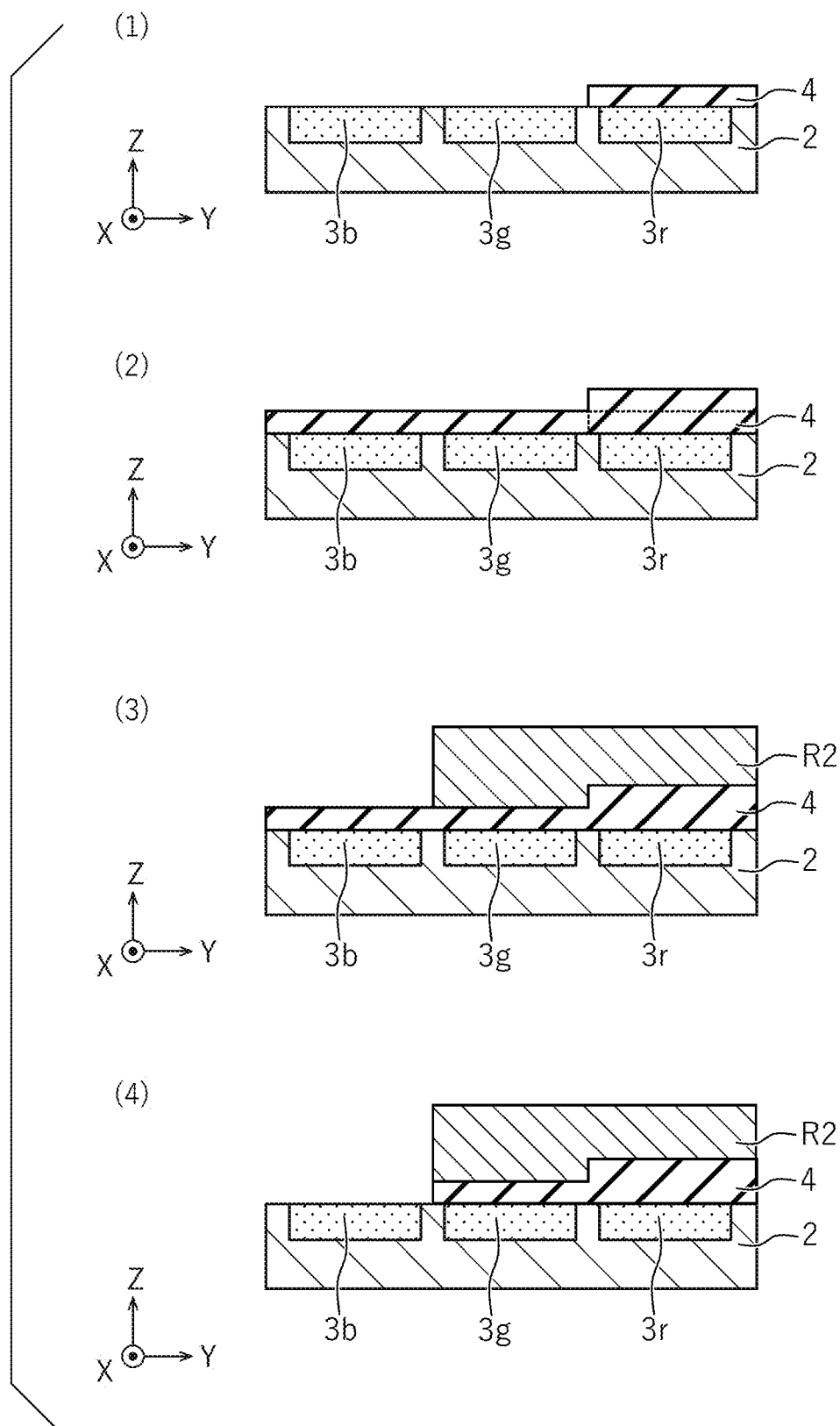
FIG. 6B is a cross-sectional view for explaining an example of the step in the method of manufacturing the solid-state imaging device according to the embodiment, following FIG. 6A.

Next, as illustrated in FIG. 6B(1), the resist mask R1 is removed using, for example, a developer.

Next, as illustrated in FIG. 6B(2), the first material is deposited again on the first insulating film 4 and the photodiodes 3b and 3g. For example, 150 Å of the first material is deposited.

Next, as illustrated in FIG. 6B(3), a photoresist is applied onto the first insulating film 4, and selectively exposed and developed to form a resist mask R2 on the first insulating film 4 above the photodiodes 3g and 3r.

Next, as illustrated in FIG. 6B(4), etching for removing the first insulating film 4 of a portion not covered with the resist mask R2 (that is, a portion on the photodiode 3b) is performed by, for example, wet etching using an etching solution. Note that all of the portions of the first insulating film 4 not covered with the resist mask may not be removed by etching.

Figure 6C:
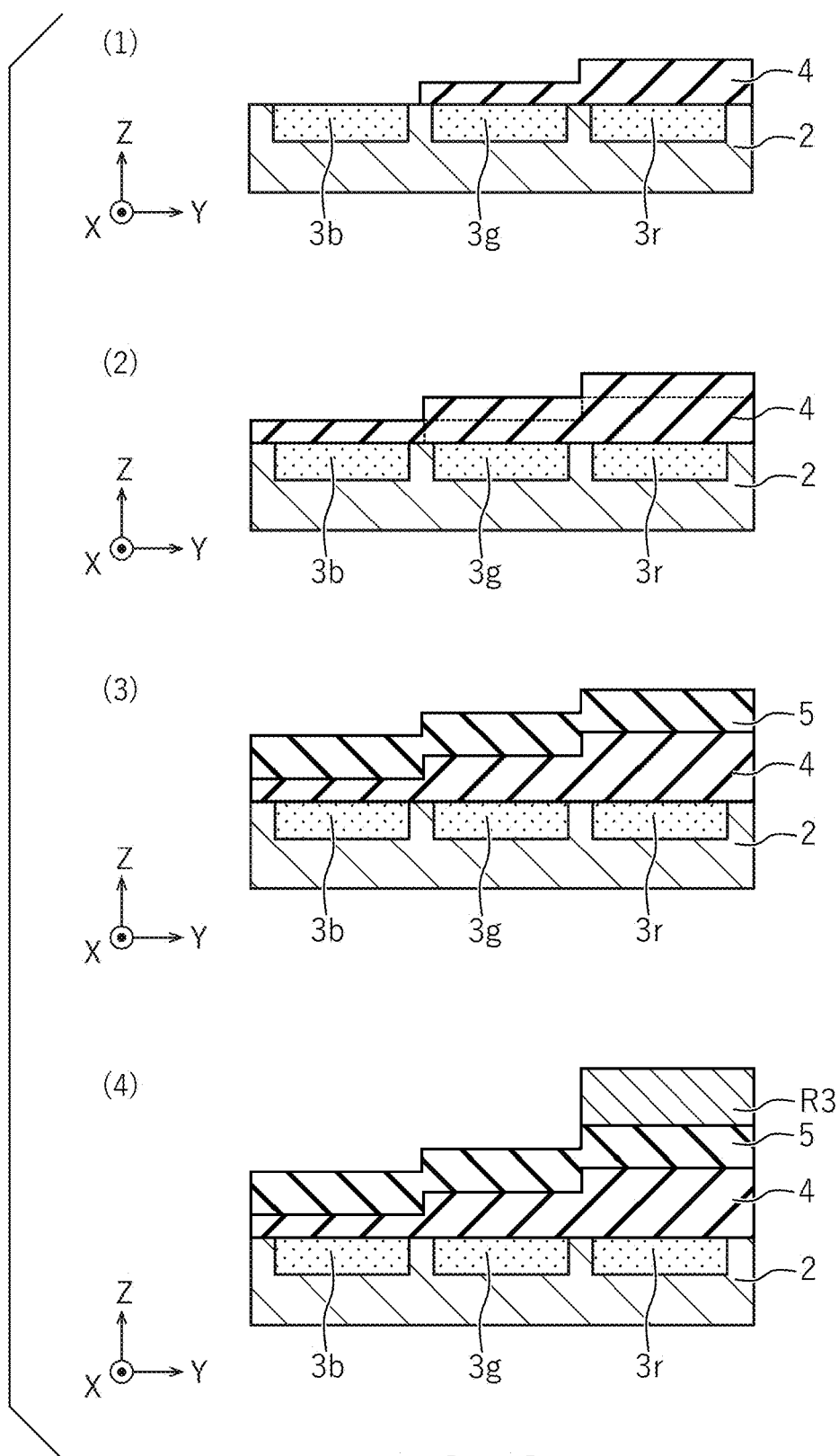
FIG. 6C is a cross-sectional view for explaining an example of the step in the method of manufacturing the solid-state imaging device according to the embodiment, following FIG. 6B.

Next, as illustrated in FIG. 6C(1), the resist mask R2 is removed using, for example, a developer.

Next, as illustrated in FIG. 6C(2), the first material is deposited again on the first insulating film 4 and the photodiode 3b. For example, 150 Å of the first material is deposited. As a result, the final first insulating film 4 is formed. The final film thickness is T4b=150 Å, T4g=300 Å, and T4r=500 Å.

Next, as illustrated in FIG. 6C(3), the second insulating film 5 is formed on the first insulating film 4. The second insulating film 5 is formed by, for example, depositing a second material on the first insulating film 4 by chemical vapor deposition (CVD). For example, 50 Å of the second material is deposited. The second material is, for example, silicon nitride, hafnium oxide, or zirconium oxide.

Next, as illustrated in FIG. 6C(4), a photoresist is applied onto the second insulating film 5, and selectively exposed and developed to form a resist mask R3 on the second insulating film 5 above the photodiode 3r.

Figure 6D:
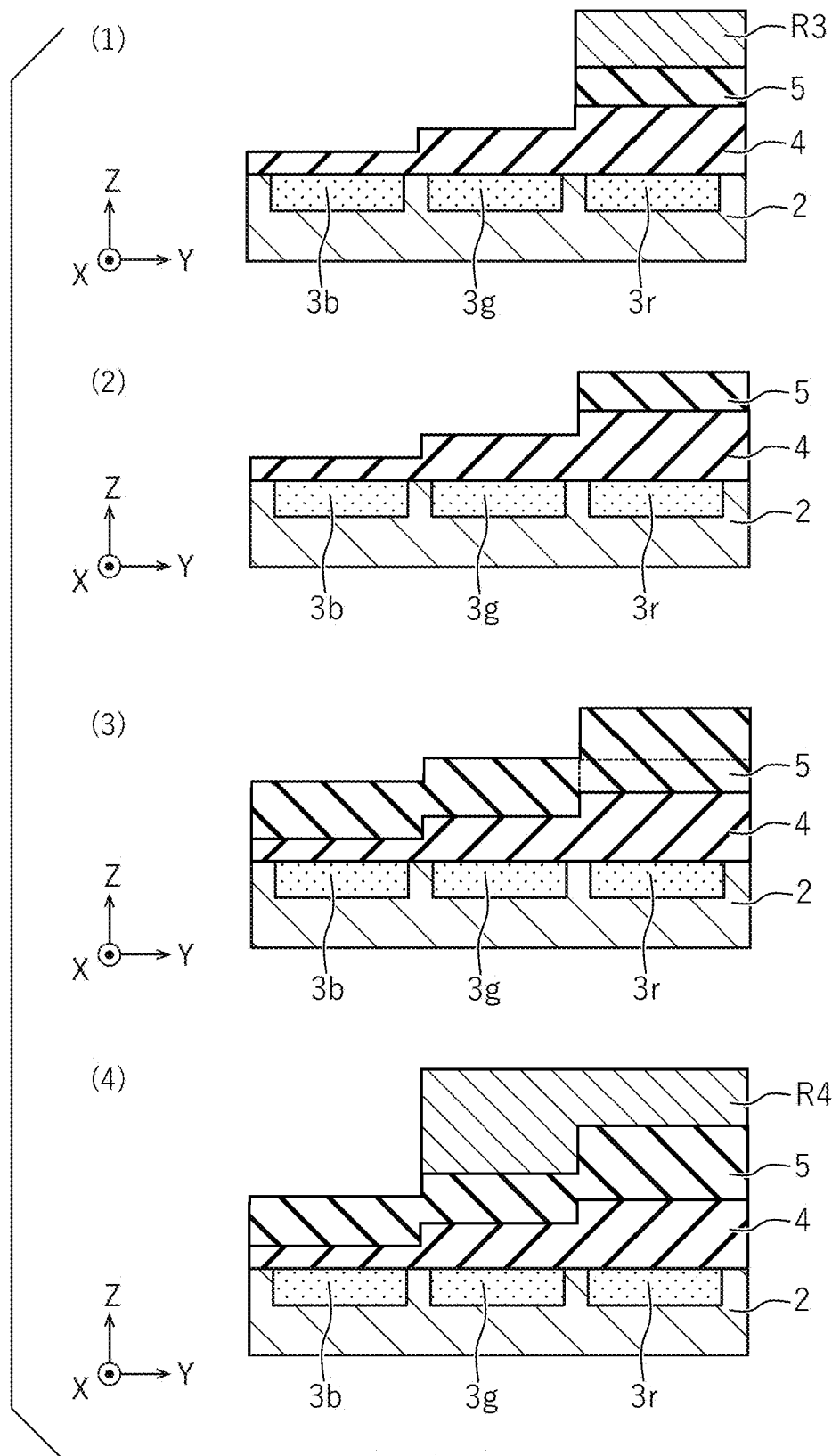
FIG. 6D is a cross-sectional view for explaining an example of the step in the method of manufacturing the solid-state imaging device according to the embodiment, following FIG. 6C.

Next, as illustrated in FIG. 6D(1), etching is performed to remove the second insulating film 5 of the portion (that is, a portion above the photodiodes 3b and 3g) not covered with the resist mask R3. The etching is, for example, wet etching using an etching solution. Note that the entire portion of the second insulating film 5 not covered with the resist mask may not be removed by etching.

Next, as illustrated in FIG. 6D(2), the resist mask R3 is removed using, for example, a developer.

Next, as illustrated in FIG. 6D(3), the second material is deposited again on the second insulating film 5 and the first insulating film 4 located on the photodiodes 3b and 3g. For example, 50 Å of the second material is deposited.

Next, as illustrated in FIG. 6D(4), a photoresist is applied onto the second insulating film 5, and selectively exposed and developed to form a resist mask R4 on the second insulating film 5 above the photodiodes 3g and 3r.

Figure 6E:
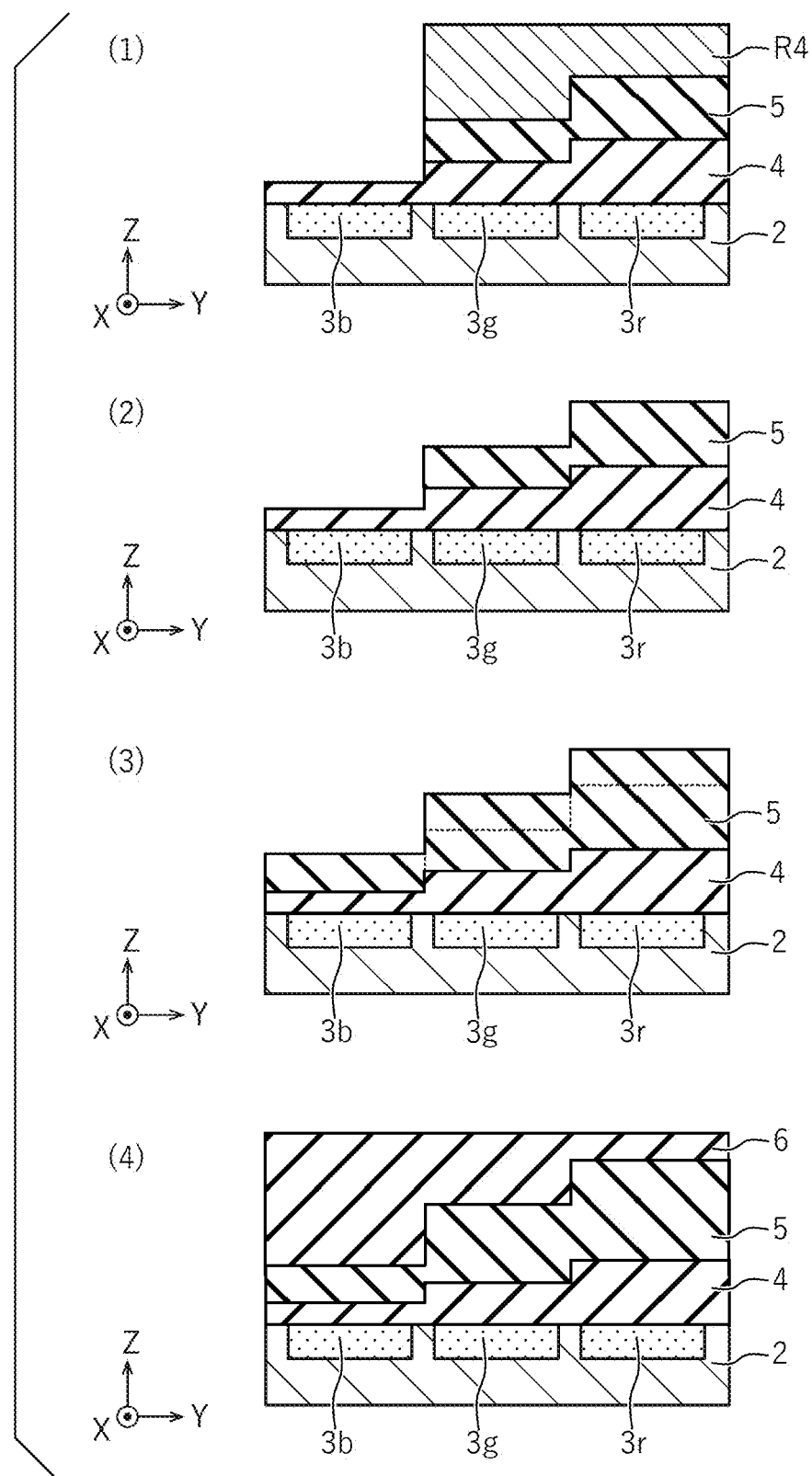
FIG. 6E is a cross-sectional view for explaining an example of the step in the method of manufacturing the solid-state imaging device according to the embodiment, following FIG. 6D.

Next, as illustrated in FIG. 6E(1), etching for removing the second insulating film 5 of the portion not covered with the resist mask R4 (that is, the portion above the photodiode 3b) is performed. Note that the entire portion of the second insulating film 5 not covered with the resist mask may not be removed by etching.

Next, as illustrated in FIG. 6E(2), the resist mask R4 is removed using, for example, a developer.

Next, as illustrated in FIG. 6E(3), the second material is deposited again on the second insulating film 5 and the first insulating film 4 located on the photodiode 3b. For example, 250 Å of the second material is deposited. As a result, the final second insulating film 5 is formed. Furthermore, the final film thickness of the second insulating film 5 is T5b=250 Å, T5g=300 Å, and T5r=350 Å.

Next, as illustrated in FIG. 6E(4), the third insulating film 6 is formed on the second insulating film 5. The third insulating film 6 is formed by, for example, depositing a third material on the second insulating film 5 by physical vapor deposition (PVD) or chemical vapor deposition (CVD). The third material is, for example, silicon oxide. Note that the film thickness of the third insulating film 6 is sufficiently larger than the film thickness of the first insulating film 4 and the film thickness of the second insulating film 5, and absorbs a difference in film thickness in each region of the first insulating film 4 and the second insulating film 5.

Next, the color filters 8b, 8g, and 8r are formed on the third insulating film 6. The color filters are formed by, for example, depositing a filter material on the third insulating film 6 by physical vapor deposition (PVD). The color filter 8 may be formed by applying (spin coating) a filter material onto the third insulating film 6. Specifically, the blue color filter 8b is formed on the third insulating film 6 in the portion located above the photodiode 3b, the green color filter 8g is formed on the third insulating film 6 in the portion located above the photodiode 3g, and the red color filter 8r is formed on the third insulating film 6 in the portion located above the photodiode 3r.

Through the above steps, the solid-state imaging device 1 according to the embodiment is manufactured. Note that the above description is merely an example of a method of manufacturing the solid-state imaging device 1, and the solid-state imaging device 1 can be manufactured by other methods.

In the solid-state imaging device according to the present embodiment described above, the film thickness in the region of each color is adjusted so as to satisfy at least one of T4b<T4g and T5b<T5g with respect to the magnitude relationship of the film thicknesses of the first insulating film 4 and the second insulating film 5. Thus, the transmittance of the blue wavelength band can be improved. Furthermore, the film thickness in the region of each color is adjusted so as to satisfy at least one of T4g<T4r and T5g<T5r with respect to the magnitude relationship of the film thicknesses of the second insulating film 5 and the third insulating film 6. Thus, the transmittance in the green wavelength band can be improved. As a result, according to the present embodiment, the transmittance can be improved in any of the blue wavelength band, the green wavelength band, and the red wavelength band, and the transmittance can be made uniform among the wavelength bands. Thus, the spectral sensitivity can be made uniform between the wavelength bands.

Moreover, since the antireflection film 7 suitable for each wavelength band can be provided, the spectral sensitivity in each wavelength band can be freely controlled.

Furthermore, the present embodiment can be similarly applied to increase the area of the solid-state imaging device, and the increase in area can be more easily realized as compared with a structure such as a microlens. Therefore, the cost of the solid-state imaging device can be reduced as compared with the case of increasing the spectral sensitivity using the microlens.

Furthermore, particularly, when at least one of T4b<T4g and T5b<T5g is satisfied, the spectral sensitivity in the blue wavelength band can be improved. As a result, an SN ratio of the optical signal in the blue wavelength band can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A solid-state imaging device comprising:
a semiconductor region in which a blue photodiode that detects blue light, a green photodiode that detects green light, and a red photodiode that detects red light are arranged;
an antireflection film including a first insulating film disposed on the semiconductor region and a second insulating film disposed on the first insulating film and having a refractive index higher than a refractive index of the first insulating film; and
a color filter disposed on the antireflection film,
wherein the color filter includes a blue color filter that attenuates light in a wavelength band other than a blue wavelength band among light incident on the blue photodiode, a green color filter that attenuates light in a wavelength band other than a green wavelength band among light incident on the green photodiode and a red color filter that attenuates light in a wavelength band other than a red wavelength band among light incident on the red photodiode,
wherein no lenses are disposed on the blue color filter, the green color filter and the red color filter,
wherein the first insulating film has a film thickness in a blue region through which light received by the blue photodiode is transmitted thinner than a film thickness in a green region through which light received by the green photodiode is transmitted.

2. The solid-state imaging device according to claim 1, wherein the first insulating film is made of silicon oxide, and the second insulating film is made of silicon nitride.

3. The solid-state imaging device according to claim 1, wherein the first insulating film is made of aluminum oxide, and the second insulating film is made of zirconium oxide.

4. The solid-state imaging device according to claim 1, wherein the first insulating film is made of silicon oxide, and the second insulating film is made of hafnium oxide.

5. The solid-state imaging device according to claim 1, wherein the antireflection film includes a third insulating film disposed on the second insulating film and having a refractive index lower than a refractive index of the second insulating film.

6. A solid-state imaging device comprising:
a semiconductor region in which a blue photodiode that detects blue light, a green photodiode that detects green light, and a red photodiode that detects red light are arranged;
an antireflection film including a first insulating film disposed on the semiconductor region and a second insulating film disposed on the first insulating film and having a refractive index higher than a refractive index of the first insulating film; and
a color filter disposed on the antireflection film,
wherein the color filter includes a blue color filter that attenuates light in a wavelength band other than a blue wavelength band among light incident on the blue photodiode, a green color filter that attenuates light in a wavelength band other than a green wavelength band among light incident on the green photodiode and a red color filter that attenuates light in a wavelength band other than a red wavelength band among light incident on the red photodiode,
wherein no lenses are disposed on the blue color filter, the green color filter and the red color filter,
wherein at least one of the first insulating film and the second insulating film has a film thickness in a blue region through which light received by the blue photodiode is transmitted thinner than a film thickness in a green region through which light received by the green photodiode is transmitted, wherein in the first insulating film, a first film thickness in the blue region is thinner than a second film thickness in the green region, and the second film thickness is thinner than a third film thickness in a red region through which light received by the red photodiode is transmitted, and in the second insulating film, a fourth film thickness in the blue region is less than or equal to a fifth film thickness in the green region, and the fifth film thickness is thinner than a sixth film thickness in the red region.

7. The solid-state imaging device according to claim 6, wherein the first insulating film is made of silicon oxide, and the second insulating film is made of silicon nitride.

8. The solid-state imaging device according to claim 6, wherein the first insulating film is made of aluminum oxide, and the second insulating film is made of zirconium oxide.

9. The solid-state imaging device according to claim 6, wherein the first insulating film is made of silicon oxide, and the second insulating film is made of hafnium oxide.

10. A solid-state imaging device comprising:
a semiconductor region in which a blue photodiode that detects blue light, a green photodiode that detects green light, and a red photodiode that detects red light are arranged;
an antireflection film including a first insulating film disposed on the semiconductor region and a second insulating film disposed on the first insulating film and having a refractive index higher than a refractive index of the first insulating film; and
a color filter disposed on the antireflection film,
wherein the color filter includes a blue color filter that attenuates light in a wavelength band other than a blue wavelength band among light incident on the blue photodiode, a green color filter that attenuates light in a wavelength band other than a green wavelength band among light incident on the green photodiode and a red color filter that attenuates light in a wavelength band other than a red wavelength band among light incident on the red photodiode,
wherein no lenses are disposed on the blue color filter, the green color filter and the red color filter,
wherein at least one of the first insulating film and the second insulating film has a film thickness in a blue region through which light received by the blue photodiode is transmitted thinner than a film thickness in a green region through which light received by the green photodiode is transmitted, wherein
in the first insulating film, a first film thickness in the blue region is thinner than a second film thickness in the green region, and a magnitude of the second film thickness is less than or equal to a magnitude of a third film thickness in a red region through which light received by the red photodiode is transmitted, and
in the second insulating film, a fourth film thickness in the blue region, a fifth film thickness in the green region, and a sixth film thickness in the red region are identical in magnitude.

11. The solid-state imaging device according to claim 10, wherein the first insulating film is made of silicon oxide, and the second insulating film is made of silicon nitride.

12. The solid-state imaging device according to claim 10, wherein the first insulating film is made of aluminum oxide, and the second insulating film is made of zirconium oxide.

13. The solid-state imaging device according to claim 10, wherein the first insulating film is made of silicon oxide, and the second insulating film is made of hafnium oxide.

14. A solid-state imaging device comprising:
a semiconductor region in which a blue photodiode that detects blue light, a green photodiode that detects green light, and a red photodiode that detects red light are arranged;
an antireflection film including a first insulating film disposed on the semiconductor region and a second insulating film disposed on the first insulating film and having a refractive index higher than a refractive index of the first insulating film; and
a color filter disposed on the antireflection film,
wherein the color filter includes a blue color filter that attenuates light in a wavelength band other than a blue wavelength band among light incident on the blue photodiode, a green color filter that attenuates light in a wavelength band other than a green wavelength band among light incident on the green photodiode and a red color filter that attenuates light in a wavelength band other than a red wavelength band among light incident on the red photodiode,
wherein no lenses are disposed on the blue color filter, the green color filter and the red color filter,
wherein at least one of the first insulating film and the second insulating film has a film thickness in a blue region through which light received by the blue photodiode is transmitted thinner than a film thickness in a green region through which light received by the green photodiode is transmitted, wherein
in the first insulating film, a first film thickness in the blue region, a second film thickness in the green region, and a third film thickness in a red region through which light received by the red photodiode is transmitted are identical in magnitude, and
in the second insulating film, a fourth film thickness in the blue region is thinner than a fifth film thickness in the green region, and a magnitude of the fifth film thickness is less than or equal to a magnitude of a sixth film thickness in the red region.

15. The solid-state imaging device according to claim 14, wherein the first insulating film is made of silicon oxide, and the second insulating film is made of silicon nitride.

16. The solid-state imaging device according to claim 14, wherein the first insulating film is made of aluminum oxide, and the second insulating film is made of zirconium oxide.

17. The solid-state imaging device according to claim 14, wherein the first insulating film is made of silicon oxide, and the second insulating film is made of hafnium oxide.

* * * * *